US008734586B2

(12) United States Patent
Jindal et al.

(10) Patent No.: US 8,734,586 B2
(45) Date of Patent: May 27, 2014

(54) PROCESS FOR CLEANING SHIELD SURFACES IN DEPOSITION SYSTEMS

(75) Inventors: Vibhu Jindal, Albany, NY (US); Junichi Kageyama, Yokohama (JP)

(73) Assignees: Sematech, Inc., Albany, NY (US); Asahi Glass Co., Ltd., Tokyo (JP)

( * ) Notice: Subject to any disclaimer, the term of this patent is extended or adjusted under 35 U.S.C. 154(b) by 104 days.

(21) Appl. No.: 13/365,077

(22) Filed: Feb. 2, 2012

(65) Prior Publication Data
US 2013/0202991 A1 Aug. 8, 2013

(51) Int. Cl.
B08B 7/00 (2006.01)

(52) U.S. Cl.
USPC .................................. 134/6; 451/38

(58) Field of Classification Search
USPC ........ 134/2, 8, 26, 6; 427/140, 446, 142, 337, 427/560; 451/38
See application file for complete search history.

(56) References Cited

U.S. PATENT DOCUMENTS

| | | |
|---|---|---|
| 2,806,000 A | 9/1957 | Streicher |
| 5,164,016 A | 11/1992 | Henriet et al. |
| 5,766,684 A | 6/1998 | Shah et al. |
| 5,858,118 A | 1/1999 | Shah et al. |
| 5,951,372 A | 9/1999 | Choquette et al. |
| 6,235,120 B1 | 5/2001 | Bang et al. |
| 6,772,776 B2 | 8/2004 | Klebanoff et al. |
| 6,942,764 B1 | 9/2005 | Lin et al. |
| 7,026,009 B2 | 4/2006 | Lin et al. |
| 7,147,722 B2 | 12/2006 | Klebanoff et al. |
| 7,579,067 B2 | 8/2009 | Lin et al. |
| 2002/0090464 A1 | 7/2002 | Jiang et al. |
| 2003/0196890 A1 | 10/2003 | Le et al. |
| 2004/0099285 A1* | 5/2004 | Wang et al. ................... 134/8 |
| 2005/0089699 A1 | 4/2005 | Lin et al. |
| 2005/0147742 A1 | 7/2005 | Kleshock et al. |
| 2005/0238807 A1* | 10/2005 | Lin et al. ................... 427/248.1 |
| 2006/0131515 A1 | 6/2006 | Partlo et al. |
| 2010/0025231 A1 | 2/2010 | Moriya et al. |

* cited by examiner

*Primary Examiner* — Stewart Fraser
(74) *Attorney, Agent, or Firm* — Nixon Peabody LLP; Khaled Shami

(57) ABSTRACT

A process for cleaning and restoring deposition shield surfaces which results in a cleaned shield having a surface roughness of between about 200 microinches and about 500 microinches and a particle surface density of less than about 0.1 particles/mm² of particles between about 1 micron and about 5 microns in size and no particles less than about 1 micron in size and method for use thereof is disclosed.

11 Claims, 5 Drawing Sheets

US 8,734,586 B2

PROCESS FOR CLEANING SHIELD SURFACES IN DEPOSITION SYSTEMS

FIELD

The present disclosure relates to a process for cleaning deposition system shields, and in particular, a process for cleaning and restoring deposition system stainless steel shields resulting in shields having a high surface roughness and low particle residue and methods for the use of the cleaned shields produced thereby.

BACKGROUND

A substrate deposition system may be used to process a substrate with an energized gas, such as plasma. Typically, the system includes a deposition chamber which encloses a process zone into which a gas is introduced, a gas energizer to energize the gas, and an exhaust to remove the energized gas. The deposition chamber may, for example, be used to deposit material on the substrate.

The chamber components exposed to the energized gas are often covered with removable shields which protect the surface of the chamber components from the sputtered residues used to deposit material on the substrate. The sputtered material coats the shield which can be removed and replaced when the layer reaches a thickness such that particles begin to flake off and contaminate the process chamber. In subsequent processing cycles, the deposited process residues can flake off of the shield surfaces and fall upon and contaminate the substrate. Therefore, the shields must be frequently periodically removed and cleaned of surface residue. Manufacturers often use sandblasting to roughen the shield, which allows them to run the sputtering chamber for longer periods of time with out a shield change, reducing the down time of process equipment. However, sandblasting leaves particle residue on the surface of the shields which can increase the chances of contamination of the substrate.

U.S. Patent Application Publication No. 2005/0089699 to Lin et al. relates to a method for cleaning and refurbishing process chamber components, such as a chamber shield having a coating. The method includes immersing the shield in an acidic cleaning solution, such as HF, $HNO_3$, HCl, $H_3PO_4$, and $H_2SO_4$, and/or a basic cleaning solution, such as KOH, $NH_4OH$, NaOH, and $K_2CO_3$, to remove process surface residue and clean or remove at least a portion of the coating of the shield. Optionally, the chemically cleaned surface can be further cleaned by performing an ultrasonic cleaning step followed by heating. The shield is then subject to a penetrative grit blast, using particles having a grit mesh size of about 80 to 120, to remove compounds between the underlying structure and the coating. The cleaned surface is then subject to a texturizing grit blast, using particles having a grit mesh size of about 24 to 70, to provide a surface roughness of about 150 to 350 microinches. Optionally, the texturized surface can be further cleaned by performing an ultrasonic cleaning step followed by heating. Once the surface of the shield has been cleaned and textured as set forth above, a metal coating is applied by a deposition process. The refurbished shield has coating having a thickness of about 152 to 508 microns and a surface roughness of about 1000 to 2000 microinches.

Thus, it is desirable to provide a process for cleaning coated shields which minimizes the amount of flake-off of process residue. It is further desirable to deposit low defect films on substrates and provide a process for cleaning coated shields resulting in a high surface roughness and low particle residue.

SUMMARY

One aspect of the present invention provides a method for cleaning and restoring deposition chamber shields, including roughening the surface of a stainless steel shield by grit blasting the shield with fresh grit blasting material, loosening particles embedded in the roughened surface by etching the surface with a chemical etch solution, and removing loosened particles from the roughened surface by at least one of a high pressure rinse and ultrasonication, to provide the shield with a surface roughness of between about 200 microinches and about 500 microinches and a surface particle density of less than about 0.1 particles/$mm^2$ of particles between about 1 micron and about 5 microns in size and no particles below about 1 micron in size.

Another aspect of the present invention provides a cleaned and restored deposition shield having a surface roughness of between about 200 microinches and about 500 microinches and a surface particle density of less than about 0.1 particles/$mm^2$ of particles between about 1 micron and about 5 microns in size and no particles below about 1 micron in size.

Another aspect of the present invention provides a EUVL mask blank and a deposition method including providing in a deposition chamber the cleaned and restored shield and depositing a layer on the EUVL mask blank.

BRIEF DESCRIPTION OF THE DRAWINGS

These and other aspects of the present invention will become apparent upon a review of the following detailed description, accompanying claims, and appended drawings, which illustrate examples of the invention, where:

DETAILED DESCRIPTION

Figure 2:
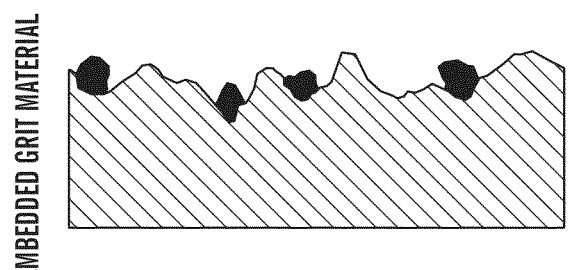
FIG. 2 is a schematic side view of the shield of FIG. 1 following grit blasting to roughen the surface.

During the sputtering process, such as manufacturing mask blank for extreme ultraviolet lithography ("EUVL"), metallic material is deposited on the substrate as well as the shields used to protect the deposition chamber surfaces. Metallic materials adhere to the shield surfaces and over time tend to flake off the shields onto the substrates and contaminate the substrates. To minimize contamination from the shields, they are periodically removed and cleaned.

The present invention relates to a process for cleaning stainless steel shield surfaces. The process results in a cleaned shield having a surface roughness of between about 200 microinches and about 500 microinches and a surface particle density of less than about 0.1 particles/mm² of particles between about 1 micron and about 5 microns in size. Preferably, the shield surfaces are cleaned to a surface roughness of between about 240 microinches and about 400 microinches, more preferably between about 260 microinches and about 350 microinches, and further preferably between about 280 microinches and about 320 microinches. Preferably, the shield surfaces are cleaned such that there is no particle residue on the surface below about 1 micron in size.

When the surface roughness of the reconditioned shields is less than about 200 microinches, the surface is too smooth. During use of these shields in a deposition process, defects coming from the shields and deposition on the shields are increased. The deposition film growth of deposited material on shields will cause stress buildup with time. The stress is relieved by cracking of the thin film deposition which causes particle generation. The resulting particles end up as defects on the substrate. Therefore, it is desirable to increase the surface roughness of the shield so as not to let stress build up as the deposited thin film is discontinuous. One method to increase surface roughness is to grit blast the surface. However, when the shield surface is grit blasted to a roughness of more than about 500 microinches, the defects coming from the shields and depositing on the substrate are increased. This is due to large particles, such as $Al_2O_3$, that reside on the shields as a result of the grit blasting process to generate such a high surface roughness shield surface.

Surface roughness is defined as $R_a$ which is the arithmetic average of the absolute values of the collected roughness data points. These values characterize the surface based on the vertical deviations of the roughness profile from the mean line. The average roughness, $R_a$, is expressed in units of height, which is typically expressed in "millionths" of an inch and is also referred to as "microinches". The surface roughness for such high roughness can be determined by electronic gauges, e.g., Mitutoyo Surftest SJ-201, where a stylus records the vertical movement along the surface measuring the displacement. The vertical displacement of the stylus is further amplified, recorded and processed to calculate the roughness value.

More than 100 shield parts inside a typical deposition system line the process chamber and protect internal components during deposition. These parts are coated with Mo, Si, and Ru material during every marathon. Therefore, the shields are removed and their surfaces cleaned afterwards. A marathon is the time period from one maintenance procedure to the next. The restoration of shield surfaces after cleaning is important and has been shown to significantly influence the resulting defects of the final mask blank. The surface of the shield must be very rough to enable the starting shield to decrease the Si family particle defect count. The Si family defect count is the total count of Si and Si/Mo defects. The defect count is the number of defect particles deposited on the blank from a deposition procedure. Additionally, any residual contaminants remaining on the shields, from either the deposition or the cleaning process, should be minimized after the cleaning treatment so that no further defects are added to the blank during the deposition.

Conventional chemical treatments that can etch the deposition cleanly have been demonstrated. However, such treatment will also smooth the shield surfaces, which is not desirable. A typical shield surface roughness achieved by conventional chemical treatment procedures is less than 20 microinches, which is an order of magnitude less than that achieved by the present invention. A physical cleaning process, such as grit blasting the shields, can be used to roughen the surface after chemical removal of the deposited material, but this process leaves a substantial amount of particle residue embedded in the surface. This particulate residue then becomes a particle source for defects during the deposition marathon. The limitations of conventional chemical and physical cleaning procedures make cleaning the shield surfaces a challenge.

The present inventors have found that analysis of the deposited mask blank defects indicates that maintaining surface roughness and leaving no particulates on the surface of the shields after cleaning can minimize these defect types. With these objectives, shield cleaning treatments were initiated resulting in the development of a shield cleaning treatment with grit blast materials, such as $Al_2O_3$, SiC, $SiO_2$, and $Si_3N_4$ to maintain surface roughness, followed by post-cleaning methods to remove embedded particles on the shield surface that can provide higher surface roughness with less than about 0.1 particles/mm² of particles between about 1 micron and about 5 microns and no particles less than about 1 micron in size on the surface.

The process in accordance with the present invention for cleaning and restoring deposition shield chambers includes grit blast and etching techniques. In one embodiment, the overall process includes the following steps: (a) pre-cleaning the surface (optional), (b) grit blast (high pressure, low working distance and use of fresh grit for every part) to obtain a very rough surface, (c) $FeCl_3$ etch to undercut and loosen the remaining particles, (d) KOH etch to etch surface particles (optional), (e) post-cleaning of etched surface (optional), (f) high pressure rinse to remove loosened particles, and/or (g) an ultrasonic step to remove loosened particles.

Grit size refers to the size of the particles of abrading materials embedded in for example sandpaper. Several different standards have been established for grit size. These standards establish not only the average grit size, but also the allowable variation from the average. The two most common are the United States CAMI (Coated Abrasive Manufacturers Institute, now part of the Unified Abrasives Manufacturers' Association) and the European FEPA (Federation of European Producers of Abrasives) "P" grade. The FEPA system is the same as the ISO 6344 standard.

Figure 1:
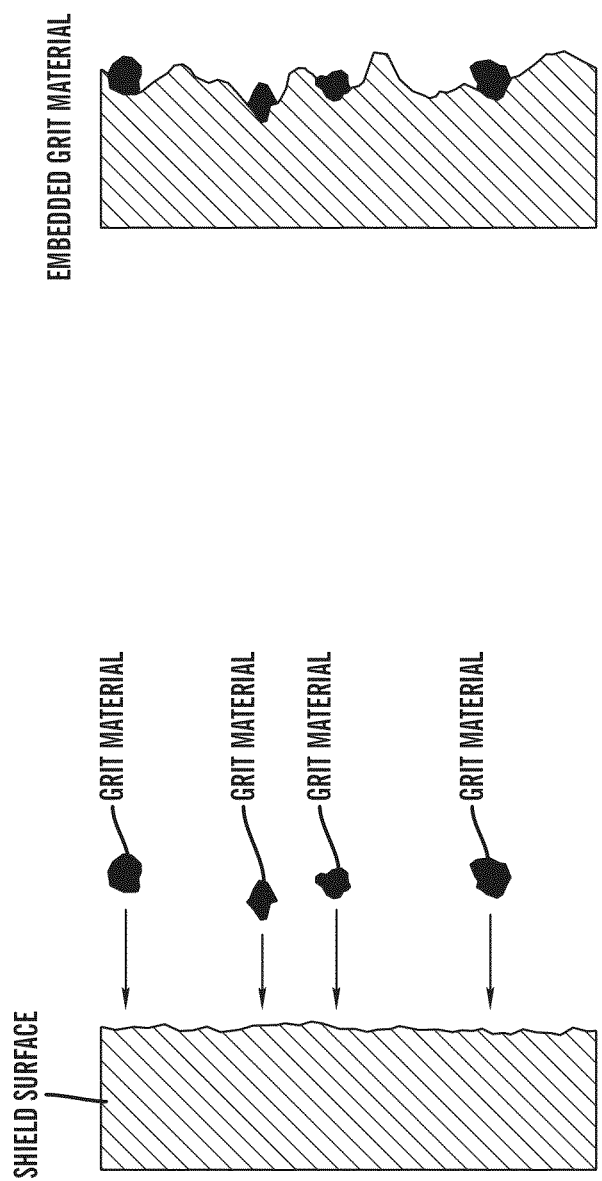
FIG. 1 is a schematic side view of an embodiment of a shield undergoing grit blasting in accordance with the present invention.

Grit blasting is a physical process in which grit blast materials such as, $Al_2O_3$ or alternatively hard materials like SiC or $SiO_2$ are blasted with high pressure to roughen the target surface, as shown in FIG. 1. The high pressure often breaks the grit material and leaves the residue embedded on the shield surface as shown in FIG. 2. Typically, the surface is grit blasted to a surface roughness of at least about 200 microinches, preferably at least about 250 microinches, so that after cleaning, a surface roughness of between about 200 microinches and about 500 microinches can be attained. Because these embedded $Al_2O_3$ particles are prominent sources of defect particles on EUVL mask blank during deposition, a follow-up cleaning procedure to remove embedded $Al_2O_3$ particles on the shield surface is employed. The cleaning procedure provides surface roughness between about 200 microinches and about 500 microinches with only a few small $Al_2O_3$ particles left on the surface. The bigger grit particles were deeply embedded in the surface giving low probability to be particle adders during deposition system.

Figure 5:
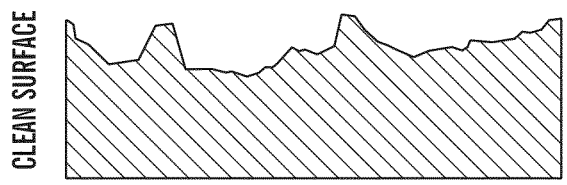
FIG. 5 is a schematic side view of the shield of FIG. 4 showing a roughened and cleaned shield surface.
Figure 4:
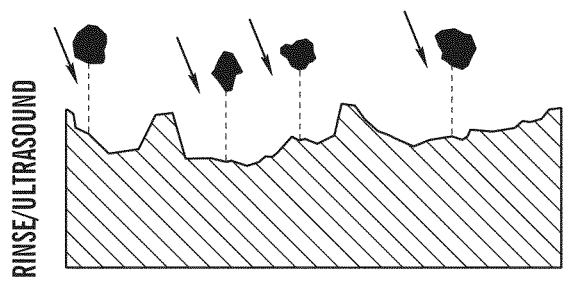
FIG. 4 is a schematic side view of the shield of FIG. 3 undergoing a high pressure rinse and/or ultrasonication to remove the loosened particles.
Figure 3:
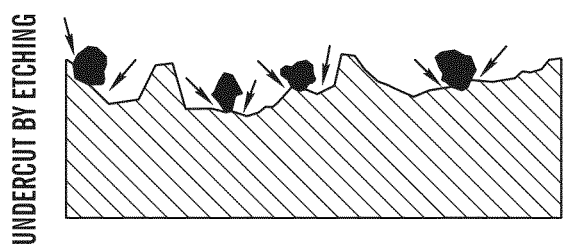
FIG. 3 is a schematic side view of the shield of FIG. 2 undergoing etching with a chemical etch solution to loosen the embedded grit particles.

The $FeCl_3$ etch step undercuts the surface and loosens adhered particles, as shown in FIG. 3, which enables subsequent removal. The pressure wash and/or ultrasonic step removes the loosened particles from the surface, as shown in FIG. 4. The process yields a surface having between about 200 microinches and about 500 microinches roughness with a surface particle density of less than about 0.1 particles/mm² of particles between about 1 micron and about 5 microns in size and no particles below about 1 micron in size, as shown in FIG. 5. The surface roughness of the cleaned surface can be determined by the stylus based measurements as described above. The particle size distribution can be determined by characterizing the surface under scanning electron microscope (SEM), model Altura 835, available from the FEI Company, Hillsboro, Oreg.

In accordance with one embodiment of the present invention, after the deposition process the used shields are soaked in a deposition stripping tank of etchant. Suitable etching solutions include about 10% HF+about 50% $HNO_3$ in water at 50° C., preferably, the % of HF can vary from about 5% to about 25% while $HNO_3$ can vary from about 30% to about 60%. The soak time can vary between about 30 minutes and about 120 minutes, depending on different shield parts selected, at a temperature of between about 50° C. and about 80° C. The shields are soaked in the solution long enough to make sure that deposition is removed as confirmed by naked eye observation. Shield parts receive different amounts of deposition after every run, which requires variability in the etching time at this step of the process. The shields can be exposed to stainless steel recycle pickle agent, such as $HF+HNO_3+H_2O$ (about 1:1:1 mixture) for about 30 seconds to about 30 minutes, preferably, the mixture of HF can vary from about 10% to about 40%, while $HNO_3$ can vary from about 10% to about 40%, and $H_2O$ can vary from about 10% to about 40%. After removal of deposition material, the shields are grit blasted with grit material, such as $Al_2O_3$, of grit size 80 at a pressure of from about 30 psi to about 75 psi, preferably about 40 psi to about 50 psi, more preferably about 45 psi. The shields can be grit blasted a second time with $Al_2O_3$ grit material of grit size 16 at a pressure of from about 30 psi to about 75 psi, preferably about 40 psi to about 50 psi, and more preferably about 45 psi. Each shield part is blasted with new grit material, as shown in FIG. 1, since the grit tends to break down to smaller and smaller sizes if recycled. The breakdown of the grit into smaller sizes adds more small particle size residue and reduces the roughness of the blasted surfaces. After a post grit blast inspection, making sure the uniformity looks good on the shield parts, the shield parts can be exposed to high pressure water rinse, preferably at a temperature of from about 50° C. to about 80° C., a pressure of from about 1 kPa to about 5 kPa, and from a time of from about 10 minutes to about 50 minutes, more preferably at a pressure of about 2 kPa for a rinse time of about 30 minutes at a temperature of about 50° C. The shield parts are soaked in an $FeCl_3$ solution for from about 90 minutes to about 120 minutes, preferably an $FeCl_3$ solution of from about 20% to about 80% mixed with water. The soaking process undercuts the stainless steel to remove $Al_2O_3$ embedded particles and surface particle residue, as shown in FIG. 3. Optionally, the shield can be additionally etched in a KOH solution of from about 20% to about 80% mixed with water for between about 90 minutes and about 120 minutes to undercut the stainless steel to remove embedded grit particles and surface particle residue. The shield parts can again be exposed to a stainless steel recycle pickle agent, such as $HF+HNO_3+H_2O$ (about a 1:1:1 mixture) for about 30 seconds to about 30 minutes, preferably about 5 minutes. Preferably, the mixture of HF can vary from about 10% to about 40% while $HNO_3$ can vary from about 10% to about 40%. The shield parts can be soaked in from about 30% to about 75% for about 30 seconds to about 30 minutes, preferably about 40% $HNO_3$ for about 10 minutes. As shown in FIG. 4 the shield parts can be exposed to a high pressure water rinse, according to the conditions noted above, preferably at a pressure of about 2 kPa for a rinse time of about 30 minutes at a temperature of about 50° C. After that the shield parts are baked in an oven at about 300° C. for about 1 hour and then a high pressure rinse of water can be performed. The shield parts can be ultrasonicated, as shown in FIG. 4, at about 5 kHz and then at about 20 kHz for between about 5 minutes and about 20 minutes, preferably between about 1 kHz to about 1 MHz. The process provides shields with a surface roughness of from about 200 microinches to about 500 microinches with a surface particle density of less than 0.1 particles/mm² of particles between about 1 micron and about 5 microns in size and no particle residue below about 1 micron in size, as shown in FIG. 5. The shield parts are then vacuum baked and packed for storage or delivery.

A mask blank is a laminate before patterning, to be used for the production of a photomask. An EUVL mask blank has a structure wherein a reflective layer to reflect EUV light and an absorber layer to absorb EUV light are formed in this order on a substrate made of, e.g., glass. As the reflective layer, a Mo/Si multilayer reflective film is usually employed wherein a molybdenum (Mo) film as a low refractive index layer and a silicon (Si) film as a high refractive index layer are alternately laminated to increase the light reflectance when the layer surface is irradiated with EUV light.

For the absorber layer, a material having a high EUV light absorption coefficient, specifically a material containing chromium (Cr) or tantalum (Ta) as the main component, is employed.

A protective layer is usually formed between the reflective layer and the absorber layer. Such a protective layer is provided for the purpose of protecting the reflective layer so that the reflective layer will not be damaged by the etching process carried out for the purpose of forming a pattern in the absorber layer. Accordingly, for the protective layer, it is preferred to employ a material not susceptible to influence by the etching process. Further, the protective layer is required not to lower the reflectance of EUV ray, since the reflective layer of the mask blank is irradiated with EUV light in a state where the protective layer is formed. For these reasons, as the constituting material for the protective layer, Ru or a Ru compound (such as RuB, RuNb or RuZr) is preferred.

In the production of an EUVL mask blank, a sputtering method is preferably employed for the formation of the Mo/Si multilayer reflective film, the protective layer and the absorber layer for such reasons that a uniform film thickness can easily be obtained, the takt time is short, the film thickness can easily be controlled, etc. Here, for the formation of the Mo film and the Si film constituting the Mo/Si multilayer reflective film, and the protective layer, an ion beam sputtering method is preferably used, and for the formation of the absorber layer, a magnetron sputtering method is preferably employed.

The sputtering method is a film-forming method wherein a sputtering target surface is bombarded by charged particles to beat out sputtered particles from the target so that the sputtered particles are deposited on a substrate disposed to face the target thereby to form a thin film. For a sputtering target to be used for such a film forming method, it is common to apply a structure wherein a target main body made of a film-forming material is held by a substrate so-called a backing plate.

EXAMPLES

The invention will be further illustrated with reference to the following specific examples. It is understood that these examples are given by way of illustration and are not meant to limit the disclosure or the claims to follow.

Comparative Example A

Figure 6:
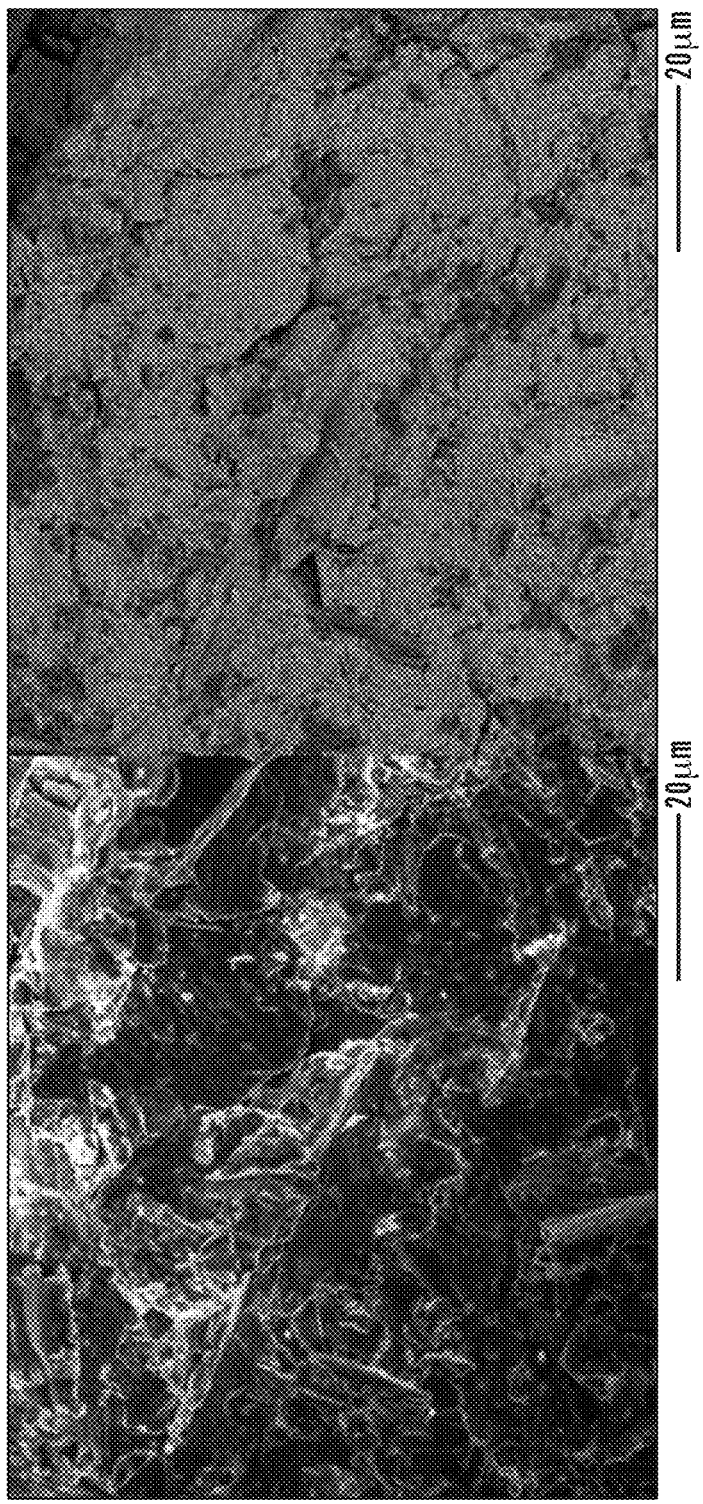
FIG. 6 is pair of SEM images of a shield surface cleaned with a conventional cleaning process according to Comparative Example A.
Figure 7:
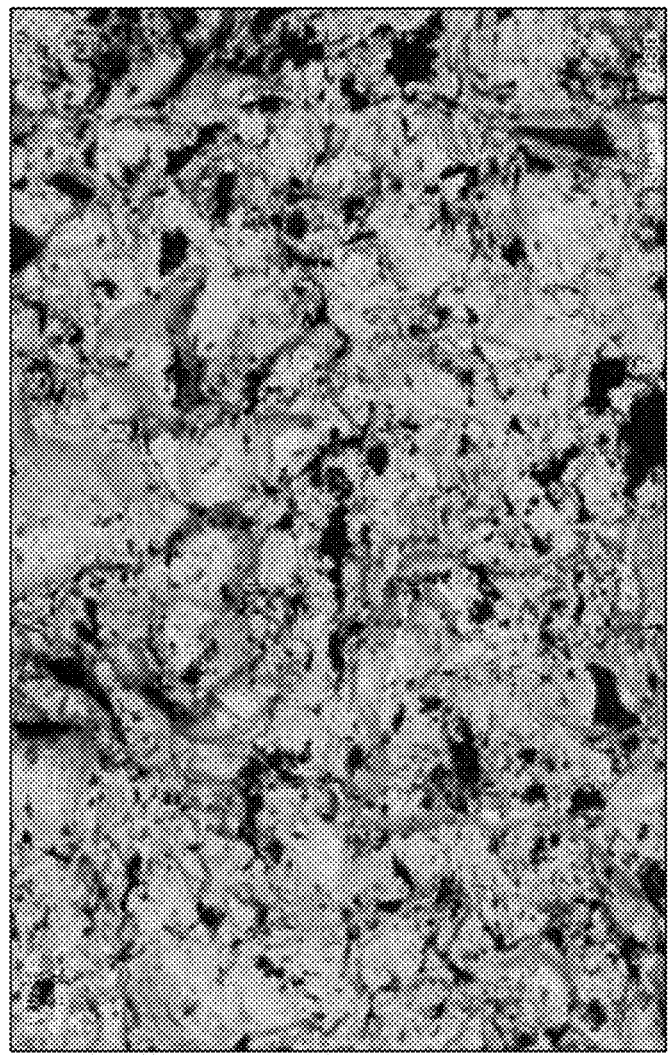
FIG. 7 is an SEM image of a shield surface cleaned with conventional cleaning process according to Comparative Example A.

A conventional physical cleaning process, such as grit blasting used shields, was performed to roughen the surface after chemical removal of the deposited material. This process left a substantial amount of particle residue embedded in the surface. Used stainless steel shield parts were cleaned by the following process. The shield parts were grit blasted with 80 grit size under a pressure of 30 psi. The grit surface residue was then blown off with dry air. The shield parts were then immersed in HCl (20%) for 5 minutes. After spray rinse with de-ionized water, the parts were blown dry with dry air. The cleaned shields had a surface roughness of from 125 to 150 microinches and a surface particle density of 100 particles/ $mm^2$. FIG. 6 shows a pair of SEM images and FIG. 7 shows an SEM image of shield surfaces cleaned with a conventional cleaning process according to Comparative Example A.

Example 1

Figure 8:
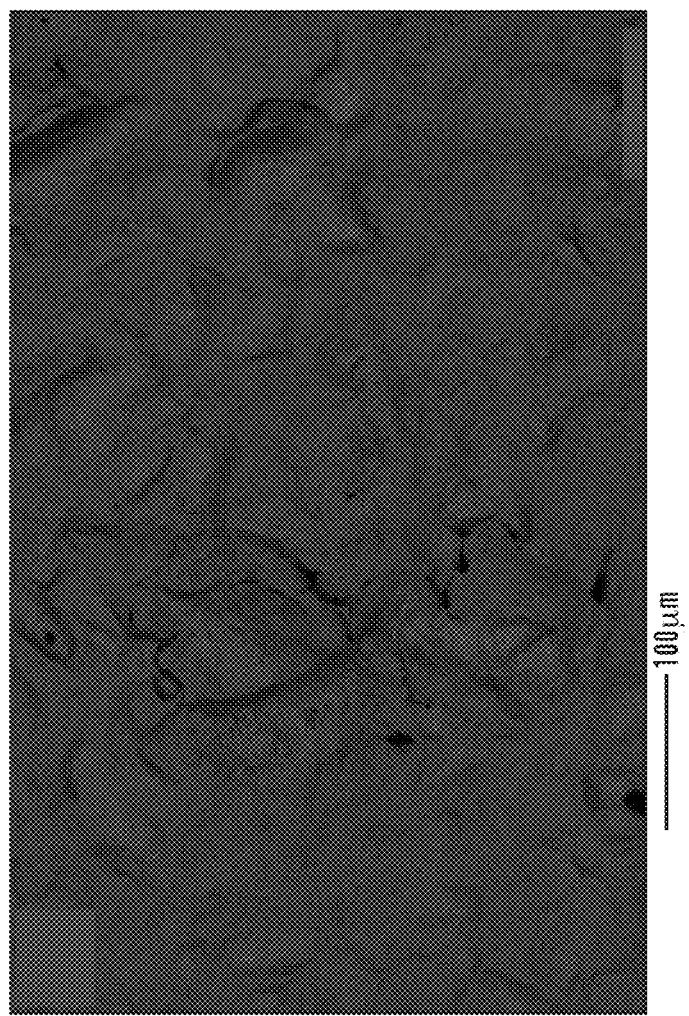
FIG. 8 is an SEM image of a shield surface cleaned according to Example 1 of the present invention.

Cleaning of used shields—After the deposition, the used stainless steel shields were soaked in a deposition stripping tank of etchant (10% HF+50% $HNO_3$ in water at 50° C.) for 30 minutes. The shields were then exposed to stainless steel recycle pickle agent HF+$HNO_3$+$H_2O$ (1:1:1 mixture) for 20 minutes. The shields were then grit blasted with $Al_2O_3$ grit material of grit size 80 at a pressure of 45 psi. The shield parts were then again grit blasted with 16 grit size at 45 psi. Each shield part is blasted with new grit material each time. After the post grit blast inspection, to make sure the uniformity looks good on the shield part, the shield parts were then exposed to high pressure water rinse. The shield parts were then soaked in $FeCl_3$ solution of 50% mixed with water for 120 minutes to undercut the stainless steel to remove $Al_2O_3$ embedded particles and surface particle residue. The shield parts were again exposed to stainless steel recycle pickle agent HF+$HNO_3$+$H_2O$ (1:1:1 mixture) for 5 minutes. Shield parts were then soaked in 40% $HNO_3$ for 10 minutes. Then the shield parts were exposed to high pressure water rinse. The shield parts were then baked in an oven at 300 ° C. for 1 hour and then a high pressure water rinse was performed. The shield parts are further ultrasonicated for 5 mintues at 5 kHz and then 5 minutes at 20 kHz. The process provided shields having a surface roughness of from about 280 to about 300 microinches with a surface particle density of less than 0.1 particles/$mm^2$ of particles between about 1 micron and about 5 microns in size and no particle residue below about 1 micron in size. FIG. 8 shows an SEM image of a shield surface cleaned according to Example 1 of the present invention.

The present invention provides cleaned and surface restored shields having the following qualities: (a) a roughness of at least about 200 microinches, (b) little or no surface particle residue, and (c) would not generate particles under ion beam deposition.

Example 2

The restored shields of Comparative Example A and Example 1 were each placed in separate deposition chambers. 150 EUVL mask blanks were produced in each chamber. These blanks for each chamber were examined for defects and the ratio of the average defect count per target for shields cleaned in Comparative Example A compared to those of Example 1 was determined to be a ratio of about 10.8 to 1.

While the invention has been described with preferred embodiments, it is to be understood that variations and modifications are to be considered within the purview and the scope of the claims appended hereto.

What is claimed is:

1. A method for cleaning and restoring deposition chamber shields, comprising:
   roughening the surface of a stainless steel shield by grit blasting the shield with fresh grit material;
   after said roughening, loosening particles embedded in the roughened surface by etching the surface with a chemical etch solution; and
   after said loosening, removing loosened particles from the roughened surface by at least one of a high pressure rinse and ultrasonication, to provide the shield with a surface roughness of between about 200 microinches and about 500 microinches and a surface particle density of less than about 0.1 particles/$mm^2$ of particles between about 1 micron and about 5 microns in size and no particles below about 1 micron in size.

2. The method according to claim 1, wherein roughening comprises grit blasting the shield with fresh grit material of grit size between about 16 and about 80 at a pressure of between about 30 and about 75 psi.

3. The method according to claim 1, wherein loosening comprises etching the shield in an $FeCl_3$ solution of from about 20% to about 80% mixed with water for between about 90 minutes and about 120 minutes to undercut the stainless steel to remove embedded grit particles and surface particle residue.

4. The method according to claim 1, wherein loosening comprises etching the shield in a KOH solution of from about 20% to about 80% mixed with water for between about 90 minutes and about 120 minutes to undercut the stainless steel to remove embedded grit particles and surface particle residue.

5. The method according to claim 1, wherein ultrasonication comprises exposing the shield to ultrasonication for between about 5 minutes and about 20 minutes at between about 5 kHz and about 20 kHz.

6. The method according to claim 1, wherein the high pressure rinse comprises a high pressure water rinse at a temperature of from about 50° C. to about 80° C., a pressure of from about 1 kPa to about 5 kPa, and from a time of from about 10 minutes to about 50 minutes.

7. The method according to claim 1, wherein the high pressure rinse comprises a high pressure water rinse at a pressure of about 2 kPa for a rinse time of about 30 minutes at a temperature of about 50° C.

8. The method according to claim 1, further comprising prior to roughening, pretreating the shield in a stripping tank of etchant containing between about 5% HF and about 25% HF plus between about 30% $HNO_3$ and about 60% $HNO_3$ in water at a temperature of between about 50° C. and about 80° C. for about 30 minutes to about 120 minutes.

9. The method according to claim 1, further comprising prior to roughening, pretreating the shield in a solution comprising HF+$HNO_3$+$H_2O$ (in about a 1:1:1 mixture) for about 30 seconds to about 30 minutes.

10. The method according to claim 1, further comprising following the etching, treating the shield in a solution comprising between about 10% and about 40% HF+between about 10% and about 40% $HNO_3$+between about 10% and about 40% $H_2O$ for about 30 seconds to about 30 minutes.

11. The method according to claim 1, further comprising following the etching, treating the shield in a solution comprising between about 30% and about 75% $HNO_3$ for about 30 seconds to about 30 minutes.

* * * * *